United States Patent
Suzuki

(10) Patent No.: US 7,755,417 B2
(45) Date of Patent: Jul. 13, 2010

(54) VOLTAGE GENERATING CIRCUIT AND SEMICONDUCTOR MEMORY DEVICE WITH THE SAME

(75) Inventor: Toshihiro Suzuki, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 161 days.

(21) Appl. No.: 11/954,376

(22) Filed: Dec. 12, 2007

(65) Prior Publication Data
US 2008/0136501 A1  Jun. 12, 2008

(30) Foreign Application Priority Data
Dec. 12, 2006  (JP) .............................. 2006-334285

(51) Int. Cl.
*G05F 1/10* (2006.01)
(52) U.S. Cl. ......................... 327/536; 363/60
(58) Field of Classification Search ................. 327/536; 363/59–60
See application file for complete search history.

(56) References Cited

U.S. PATENT DOCUMENTS

| | | | | |
|---|---|---|---|---|
| 5,159,543 A * | 10/1992 | Yamawaki | .................... | 363/60 |
| 5,563,779 A * | 10/1996 | Cave et al. | ..................... | 363/59 |
| 5,703,807 A * | 12/1997 | Smayling et al. | ....... | 365/185.03 |
| 5,909,398 A * | 6/1999 | Tanzawa et al. | ........ | 365/185.29 |
| 6,208,198 B1 * | 3/2001 | Lee | ............................ | 327/536 |
| 6,249,445 B1 * | 6/2001 | Sugasawa | ..................... | 363/60 |
| 6,337,595 B1 * | 1/2002 | Hsu et al. | .................... | 327/538 |
| 6,404,274 B1 | 6/2002 | Hosono et al. | | |
| 6,426,892 B2 | 7/2002 | Shibata et al. | | |
| 6,560,145 B2 * | 5/2003 | Martines et al. | ........ | 365/185.18 |
| 6,756,838 B1 * | 6/2004 | Wu et al. | ..................... | 327/536 |
| 7,253,676 B2 * | 8/2007 | Fukuda et al. | .............. | 327/536 |
| 7,279,959 B1 * | 10/2007 | Choy | .......................... | 327/536 |
| 7,304,528 B2 * | 12/2007 | Kim et al. | ................... | 327/534 |
| 7,348,829 B2 * | 3/2008 | Choy et al. | ................. | 327/536 |

FOREIGN PATENT DOCUMENTS

JP  10-208488  8/1998

* cited by examiner

*Primary Examiner*—Lincoln Donovan
*Assistant Examiner*—Thomas J Hiltunen
(74) *Attorney, Agent, or Firm*—Oblon, Spivak, McClelland, Maier & Neustadt, L.L.P.

(57) ABSTRACT

A voltage generating circuit includes: a pumping circuit configured to boost a power supply voltage in accordance with a charge transfer operation; a voltage detection circuit configured to detect the output voltage of the pumping circuit; a first pumping control circuit configured to control the pumping circuit in accordance with the output of the voltage detection circuit; and a second pumping control circuit configured to control the pumping circuit in place of the first pumping control circuit when the output voltage of the pumping circuit is in a certain range.

17 Claims, 13 Drawing Sheets

VOLTAGE GENERATING CIRCUIT AND SEMICONDUCTOR MEMORY DEVICE WITH THE SAME

CROSS-REFERENCE TO RELATED APPLICATION

This application is based on and claims the benefit of priority from the prior Japanese Patent Application No. 2006-334285, filed on Dec. 12, 2006, the entire contents of which are incorporated herein by reference.

BACKGROUND OF THE INVENTION

1. Field of the Invention

This invention relates to a voltage generating circuit for outputting a boosted voltage and a semiconductor memory device with the same.

2. Description of the Related Art

A NAND-type flash memory is known as one of electrically rewritable and non-volatile semiconductor memories (EEPROMs). The NAND-type flash memory is formed of multiple memory cells connected in series in such a manner that adjacent two memory cells share a source/drain diffusion layer. Therefore, it has such a feature that the unit cell area is small and it is easy to increase the capacity.

In the EEPROM, it is required to generate various internal voltages, which are boosted from a power supply voltage and used in data read, write and erase modes. A boost circuit for generating such the internal voltage is basically constituted by a charge-pumping circuit and a voltage detection circuit (i.e., limiter circuit) for detecting the output voltage of the charge-pumping circuit to control activation/inactivation thereof.

In case it is used such a step-up write scheme that write pulse voltage application and write-verify are repeatedly performed with the write voltage Vpgm stepped-up by ΔVpgm for every write cycle, it is also necessary to attach an adding circuit for adding ΔVpgm to the write voltage at every cycle.

As the above-described write voltage generating circuit, it has been provided such an example that the step-up voltage is added with a current-adding type of D/A converter (for example, refer to Unexamined Japanese Patent Application Publication No. 11-353889).

To store music data and image data in various mobile devices, it is increased more and more the demand for NAND-type flash memories. To make the storage capacity large more under such the situation, it is necessary to use a multi-level data storage scheme with multiple bits per cell. Therefore, there has been provided various multi-level data storage schemes (for example, refer to Unexamined Japanese Patent Application Publication No. 2001-93288).

SUMMARY OF THE INVENTION

According to an aspect of the present invention, there is provided a voltage generating circuit including:

a pumping circuit configured to boost a power supply voltage in accordance with a charge transfer operation;

a voltage detection circuit configured to detect the output voltage of the pumping circuit;

a first pumping control circuit configured to control the pumping circuit in accordance with the output of the voltage detection circuit; and a second pumping control circuit configured to control the pumping circuit in place of the first pumping control circuit when the output voltage of the pumping circuit is in a certain range.

According to another aspect of the present invention, there is provided a semiconductor memory device with an internal voltage generating circuit, the internal voltage generating circuit including:

a pumping circuit configured to boost a power supply voltage in accordance with a charge transfer operation;

a voltage detection circuit configured to detect the output voltage of the pumping circuit;

a first pumping control circuit configured to control the pumping circuit in accordance with the output of the voltage detection circuit; and a second pumping control circuit configured to control the pumping circuit in place of the first pumping control circuit when the output voltage of the pumping circuit is in a certain range.

DETAILED DESCRIPTION OF THE EMBODIMENTS

Illustrative embodiments of this invention will be explained with reference to the accompanying drawings below.

Figure 1:
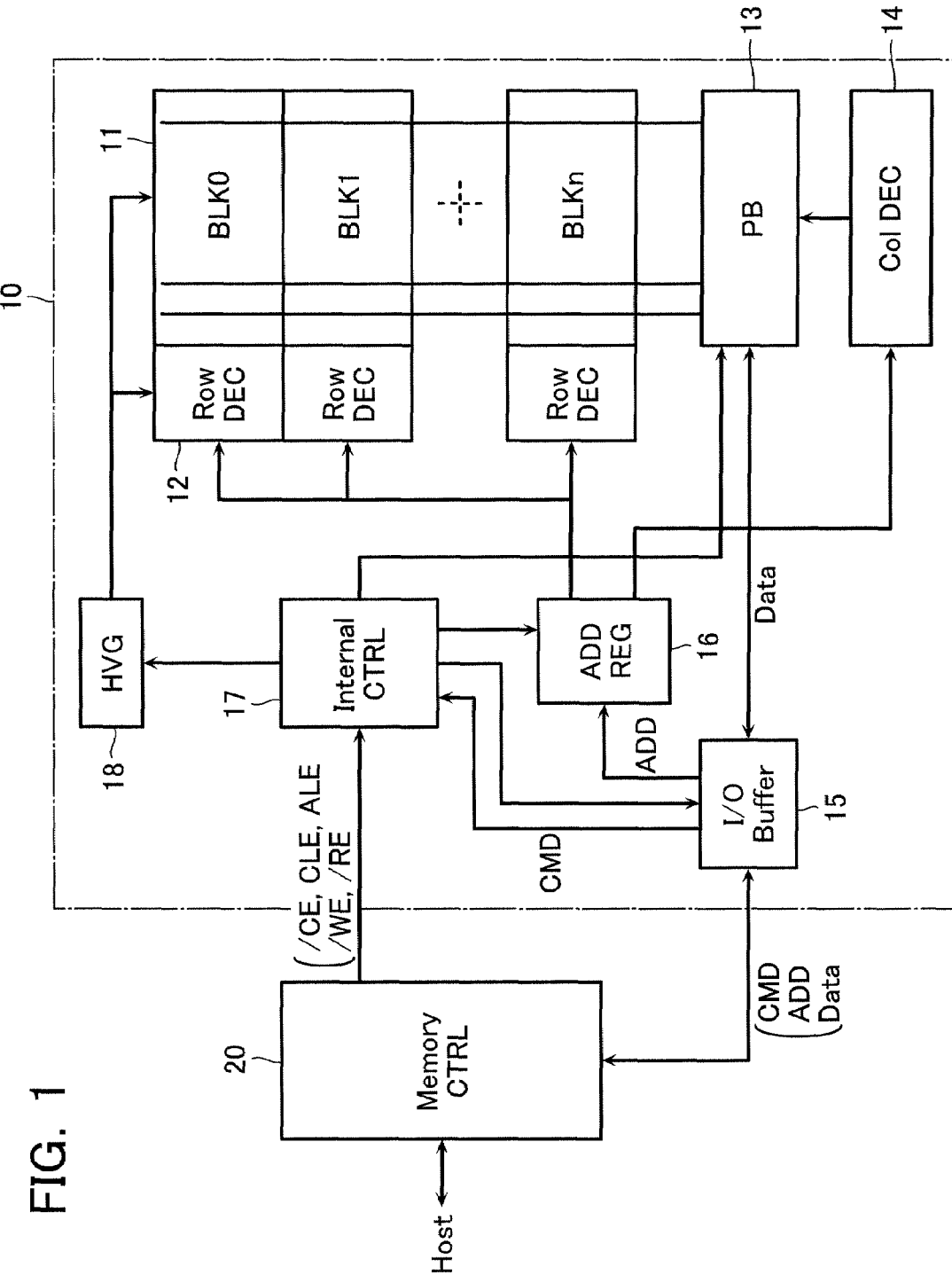
FIG. 1 shows a configuration of a flash memory in accordance with an embodiment of the present invention.
Figure 2:
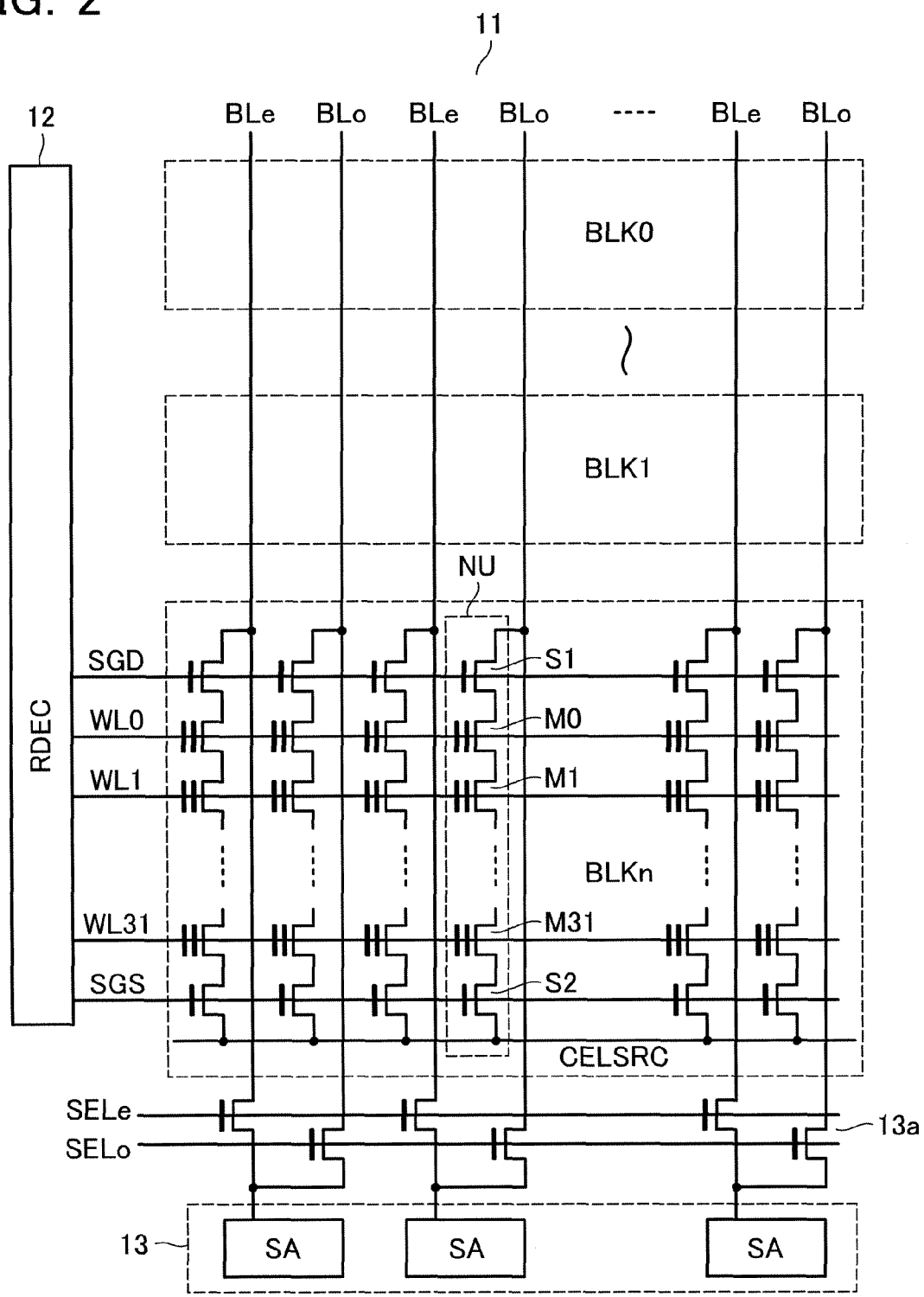
FIG. 2 shows the memory cell array of the flash memory.

FIG. 1 shows a configuration of a NAND-type flash memory device in accordance with an embodiment. Flash memory chip 10 contains a cell array 11, a row decoder 12 for selecting a word line in the cell array 11, a page buffer 13 coupled to bit lines to sense one page data and load one page write data, a column decoder 14 for selecting a column and the like. Cell array 11 is, as shown in FIG. 2, formed of multiple NAND cell units (NAND strings) arranged therein.

Each NAND cell unit NU has a plurality of electrically rewritable and non-volatile memory cells M0-M31 connected in series. At the both ends, there are disposed select gate transistors S1 and S2 for coupling the NAND cell unit to a bit line BL and a source line CELSRC, respectively.

The control gates of the memory cells M0-M31 are coupled to different word lines WL0-WL31, respectively, and gates of the select gate transistors S1 and S2 are coupled to select gate lines SGD and SGS, respectively, which are disposed in parallel with the word lines.

A set of NAND cell units sharing the word lines is defined as a block serving as an erase unit. As shown in FIG. 2, multiple blocks, BLK0-BLKn, are arranged in the bit line direction.

FIG. 2 shows an example that an even numbered bit line BLe and an odd numbered bit line BLo share a sense amplifier SA. That is, either the even numbered bit line BLe or odd numbered bit line BLo is selected with a bit line selector circuit 13a to be coupled to the sense amplifier SA.

A cell range defined by the whole even bit lines and a selected word line serves as a physical page (even page) while another cell range defined by the whole odd bit lines and a selected word line serves as another physical page (odd page). The page buffer 13 is formed of sense amplifiers SA, which are able to store one page read/write data.

Internal controller 17 formed in the chip receives various kinds of external control signals (chip enable signal /CE, command latch enable signal /CLE, address latch enable signal ALE, write enable signal /WE, read enable signal /RE and the like) and command CMD to control read/write/erase of the cell array 11.

There is prepared a high voltage generation circuit (internal voltage generating circuit) 18 for various high voltages used at the read/write/erase times, which is also controlled by the internal controller 17.

Note here that a part or main portions of the functions of the internal controller 17 may be contained in an external memory controller 20. For example, while the function of the internal controller 17 may be limited to voltage control, timing control and read control of the ROM fuse area of the cell array 11 at a power-on reset time, a write sequencer function of the internal controller 17 may be installed as software in the memory controller 20.

In this case, the software data is written in the ROM fuse area of the cell array 11, and read out at the power-on reset time to be transferred to and developed on the memory controller 20.

Address ADD, command CMD and data Data are supplied via I/O buffer 15. Address ADD is transferred to row decoder 12 and column decoder 14 via address register 16 while command CMD is transferred to the internal controller 17 and decoded therein.

In this embodiment, the flash memory stores multi-level data defined by multi bits per cell.

Figure 3:
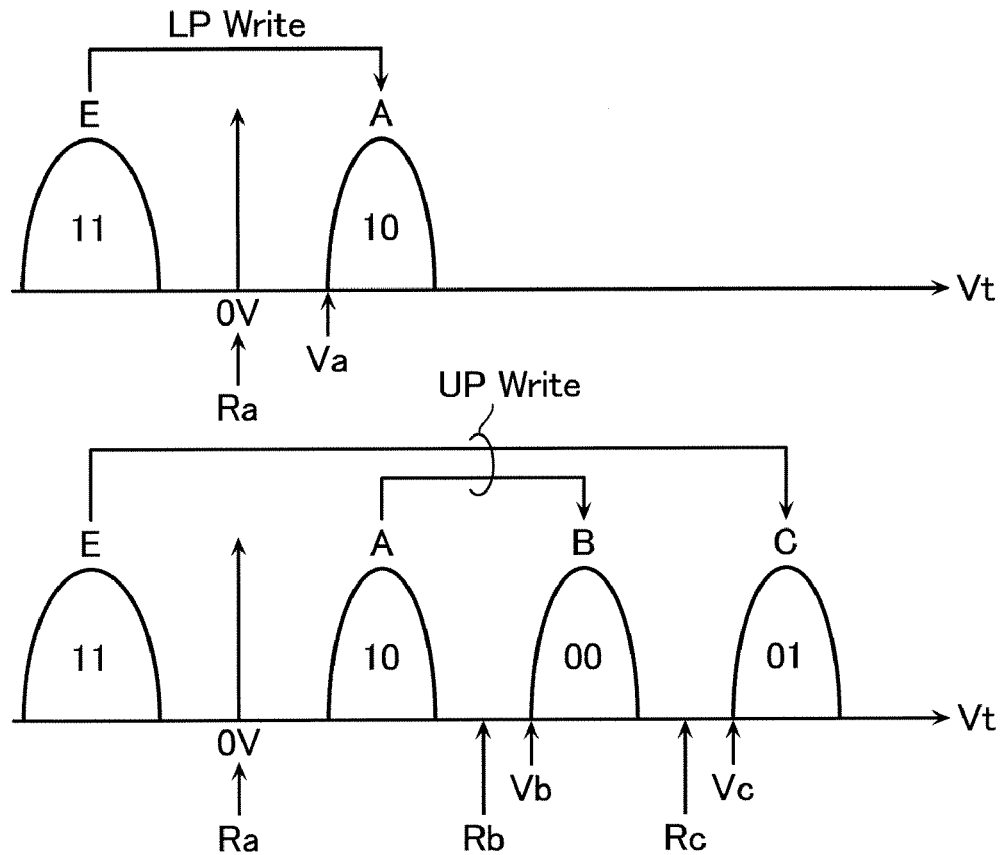
FIG. 3 shows a data threshold distribution in case of a four-level data storage scheme and the data writing method.

FIG. 3 shows a data threshold distribution and a data bit assignment of a four-level data storage scheme defined by 2-bits/cell. Shown at the lower stage in FIG. 3 are the threshold distribution and the data bit assignment of four-level data A, B, C and D.

Erase state E is a negative threshold state while write states A, B and C are positive threshold states. Four-level data is expressed by (UP, LP) with an upper page data bit UP and a lower page data bit LP. In the case shown in FIG. 3, the four-level data is defined as follows: E=(1, 1), A=(1, 0), B=(0, 0) and C=(0, 1).

For writing the four-level data, firstly, lower page (LP) write is performed. In this LP write sequence, "0" write is selectively performed for cells in the erase state E in such a manner as to boost the cell's threshold voltage. Obtained as the result is data state A, in which the lower limit of the threshold voltage is defined by verify voltage Va.

In the following upper page (UP) write sequence, "0" write for boosting cell's threshold voltage is selectively performed for data states E and A to obtain data states C and B defined by verify voltages Vc and Vb, respectively. Write voltage application is performed for these cells simultaneously while write-verify operations are performed independently of each other with two steps by use of verify voltages Vb and Vc.

The above-described four-level data may be read out as follows: the upper page data is read with a read voltage set between data states A and B; and the lower page data is read out with two read operations with read voltages Ra and Rc set between data states E and A and between data states B and C, respectively.

Figure 4:
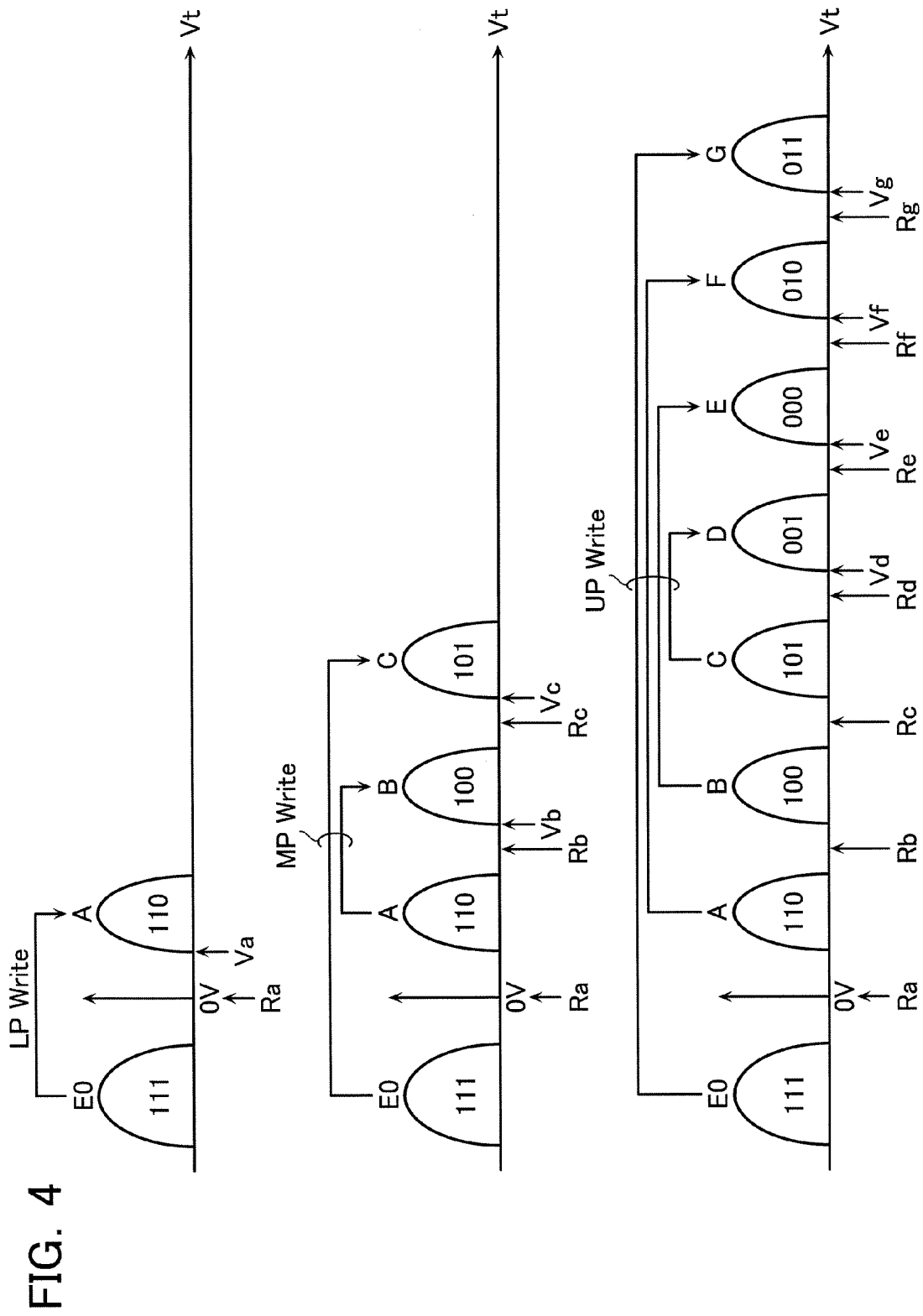
FIG. 4 shows a data threshold distribution in case of an eight-level data storage scheme and the data writing method.

FIG. 4 shows the data threshold distribution and data bit assignment in case of an eight-level data storage scheme that is an extended version of the above-described four-level data storage scheme.

Eight-level data is expressed by (UP, MP, LP), where UP, MP and LP are upper page, medium page and lower page data bits, respectively, based on eight data states E0, A, B, C, D, E, F and G.

Initially, in accordance with the lower page (LP) write, cells in the erased threshold voltage state E0 are selectively set at data state A defined by verify voltage Va.

Next, in accordance with the medium page (MP) write, cells in data states E0 and A are selectively set at data states C and B with write-verify using verify voltages Vc and Vb, respectively.

Similarly, in accordance with the upper page (UP) write including write-verify operations with verify voltages Vd-Vg, data states D, E, F and G are obtained.

Figure 5:
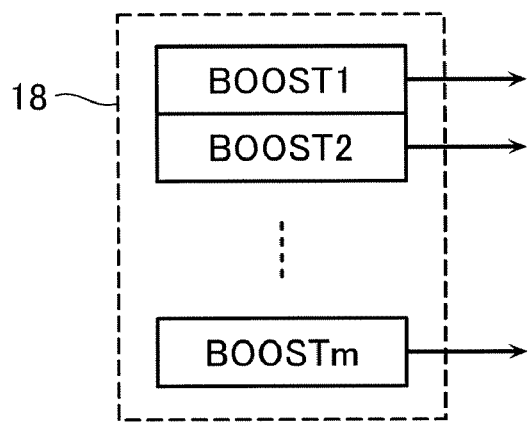
FIG. 5 shows the high voltage generating circuit used in the flash memory.
Figure 6:
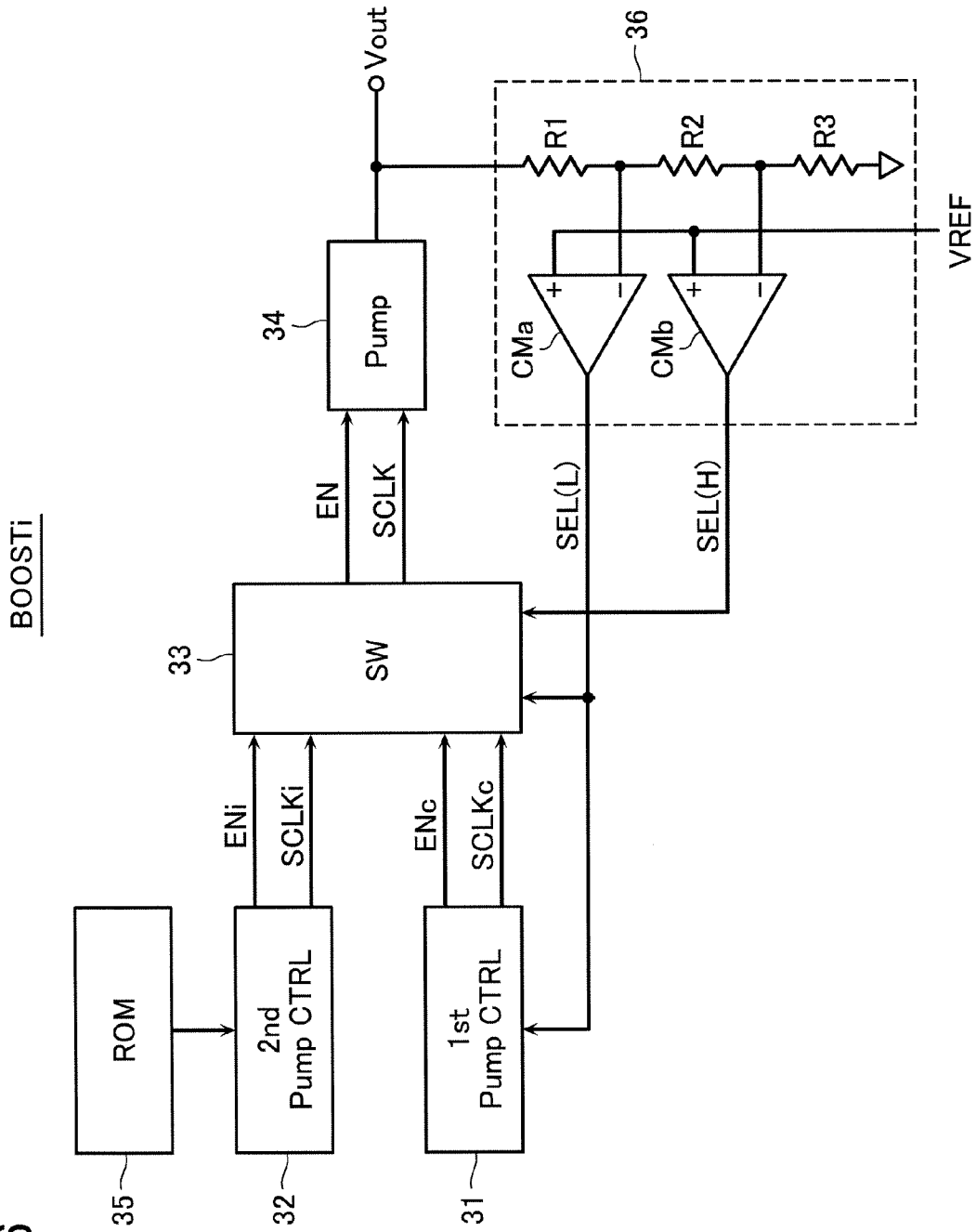
FIG. 6 shows the boost circuit used in the high voltage generating circuit.

High voltage generating circuit 18 is, as shown in FIG. 5, constituted by multiple boost circuits BOOST1-m for generating various boosted voltages required in accordance with write, erase and read modes. FIG. 6 shows a detailed configuration of one boost circuit BOOSTi in the high voltage generating circuit 18.

Boost circuit BOOSTi has: pumping circuit 34 for boosting a power supply voltage in accordance with a one-directional charge transfer operation; voltage detection circuit 36 for detecting the output voltage of the pumping circuit 34; and first pumping control circuit 31 for controlling the activation/inactivation of the pumping circuit 34 in accordance with the output of the voltage detection circuit 36.

Disposed independently of the first pumping control circuit 31 is a second pumping control circuit 32, which controls the pumping circuit 34 in place of the first pumping control circuit 31 in such a state that the output voltage of the pumping circuit 34 is boosted in a certain range. Enable signal ENc and clock signal SCLKc of the first pumping control circuit 31, and enable signal ENi and clock signal SCLKi of the second pumping control circuit 32 are changed by switching circuit 33 to be selectively supplied to the pumping circuit 34.

The first pumping control circuit 31 becomes ON/OFF based on the output voltage detection of the pumping circuit 34 as similar to a normally used boost circuit, and drive the pumping circuit 34 with a constant clock frequency during ON.

By contrast, the second pumping control circuit 32 adaptively controls the pumping circuit 34 to be in a certain voltage range near a desirable output voltage without making the pumping circuit 34 ON/OFF and with a variable clock frequency based on the control data previously programmed in a ROM circuit 35. By use of this second pumping control circuit 32, it becomes possible to remove the voltage ripple of the pumping circuit 34 and generate an output voltage with an about constant level unlike the case where the pumping circuit 34 is made ON/OFF.

Explaining in detail, the control data programmed in the ROM circuit 35 is decided based on the measurement result of the leakage property of the pumping circuit 34 to be necessary for achieving a constant output voltage level in consideration of the drivability of the pumping circuit 34. The control data in the ROM circuit 35 is, for example, developed on the second pumping control circuit 32 as a reset operation at a power-on time.

When the output voltage reaches a certain level under the pumping control of the first pumping control circuit 31, the second pumping control circuit 32 becomes on in place of the first pumping control circuit 31, and generates necessary enable signal ENi and clock control signal SCLKi for selecting a clock frequency, thereby controlling the pumping circuit 34.

Figure 7:
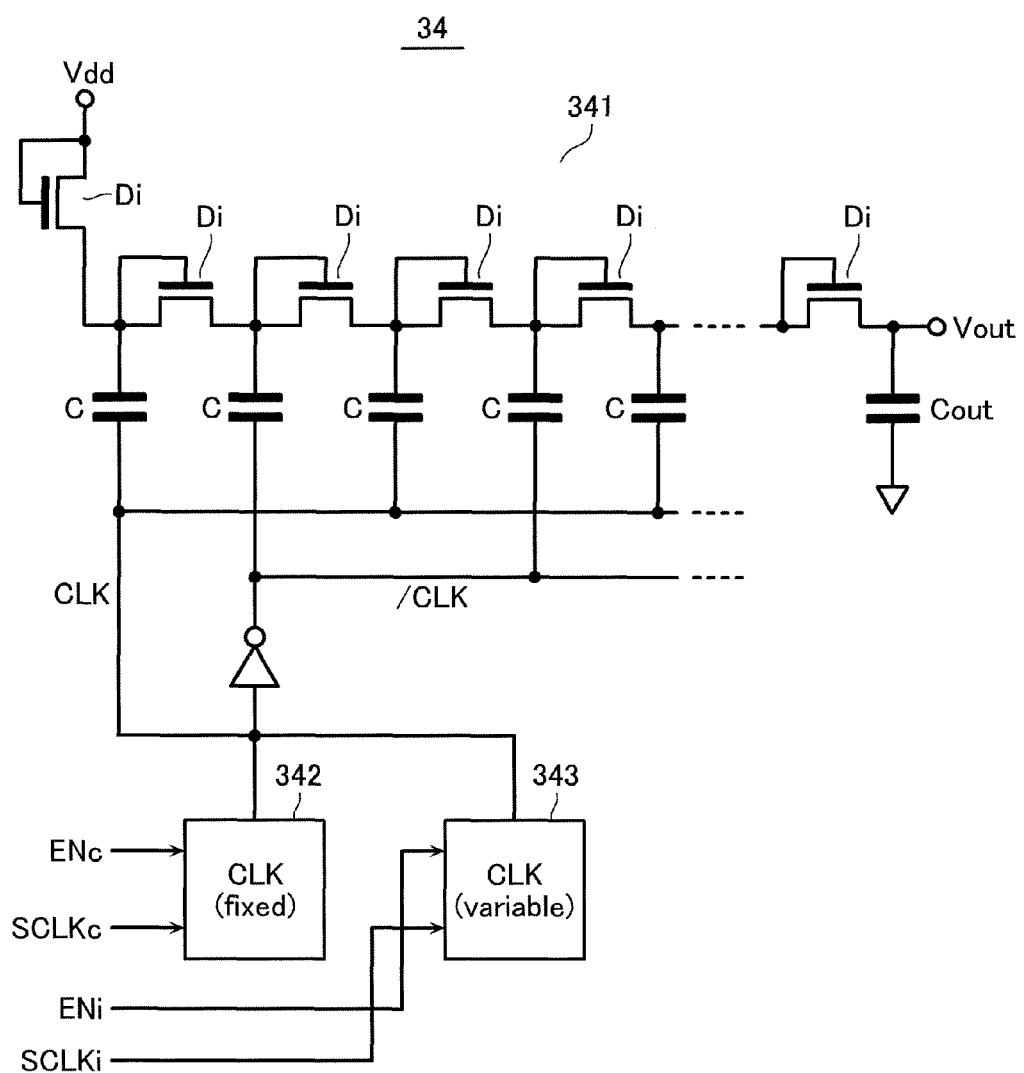
FIG. 7 shows the pumping circuit used in the boost circuit.

FIG. 7 shows a detailed configuration of the pumping circuit 34. As shown in FIG. 7, the pumping circuit 34 is a so-called charge pumping circuit, which has: a charge transfer circuit 341 with diodes Di connected in series between the power supply node Vdd and the output node Vout; and capacitors C, one ends of which are coupled to the respective connection nodes of the charge transfer circuit 341. The other ends of the capacitors C are driven by clocks CLK and /CLK with different phases from each other. With this configuration, one-directional charge transfer operation is performed in the charge transfer circuit 341, and a boosted output voltage will be obtained at the output node Vout.

As clock generating circuits for driving the charge transfer circuit 341, there are prepared a clock generator 342 with a fixed frequency and another clock generator 343 with a variable frequency. The clock generator 342 is a clock source controlled by control signal ENc and SCLKc generated from the first pumping control circuit 31 while the clock generator 343 is a clock source controlled by control signal ENi and SCLKi generated from the second pumping control circuit 32.

Voltage detection circuit 36 has resistors R1, R2 and R3 connected in series between the output node Vout and the ground node Vss, and comparators CMa and CMb, which compare voltages at the respective connection nodes of the resistors and a reference voltage VREF to output select signals (voltage detection flags) SEL(L) and SEL(H), respectively.

Figure 8:
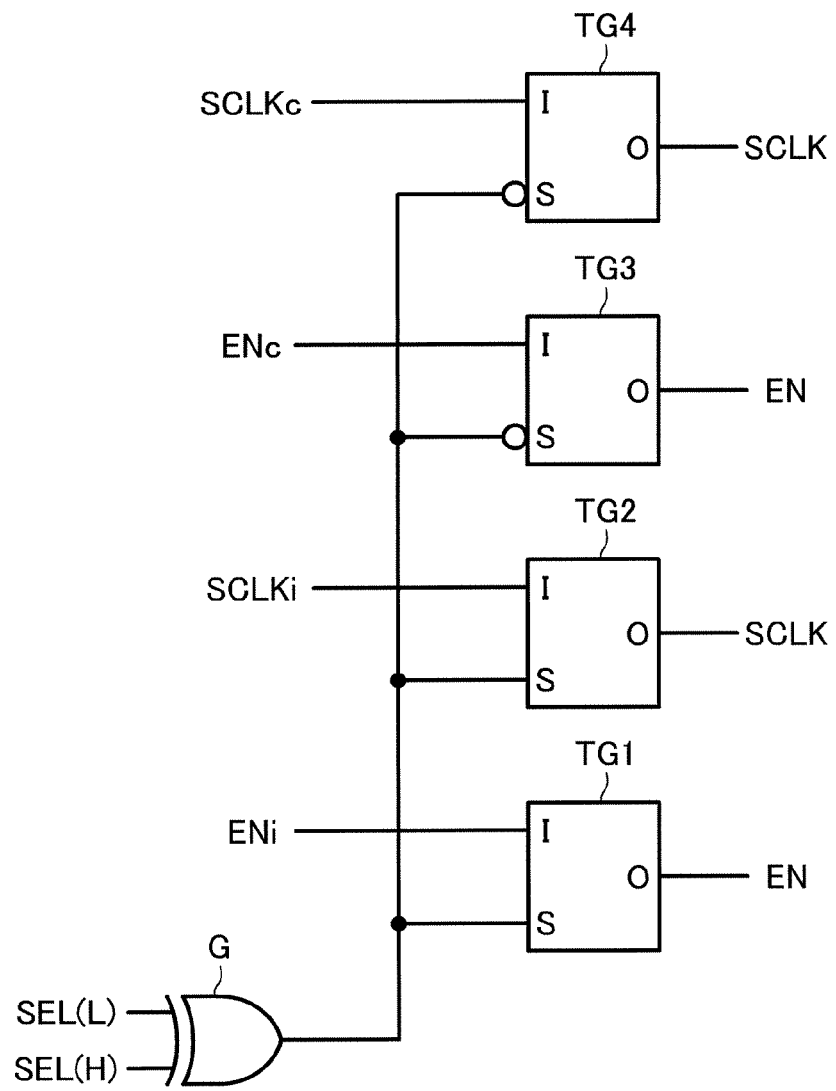
FIG. 8 shows the switching circuit used in the boost circuit.
Figure 9:
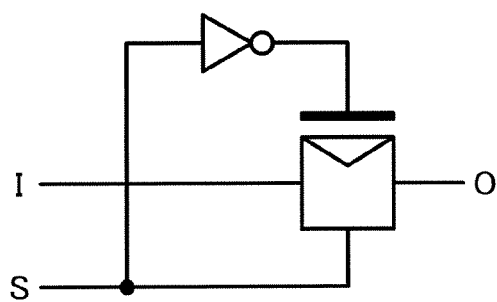
FIG. 9 shows the transfer gate used in the switching circuit.

FIG. 8 shows a detailed configuration of the switching circuit 33. This circuit has: transfer gates TG1 and TG2 for transferring the control signals ENi and SCLKi of the second pumping control circuit 31; and transfer gates TG3 and TG4 for transferring the control signals ENc and SCLKc of the first pumping control circuit 32. Each of these transfer gates TG1-TG4 is, for example, a CMOS transfer gate shown in FIG. 9. Further, there is prepared an exclusive OR logic gate G for selectively turn on or off the transfer gates (TG1, TG2) or (TG3, TG4).

Figure 10:
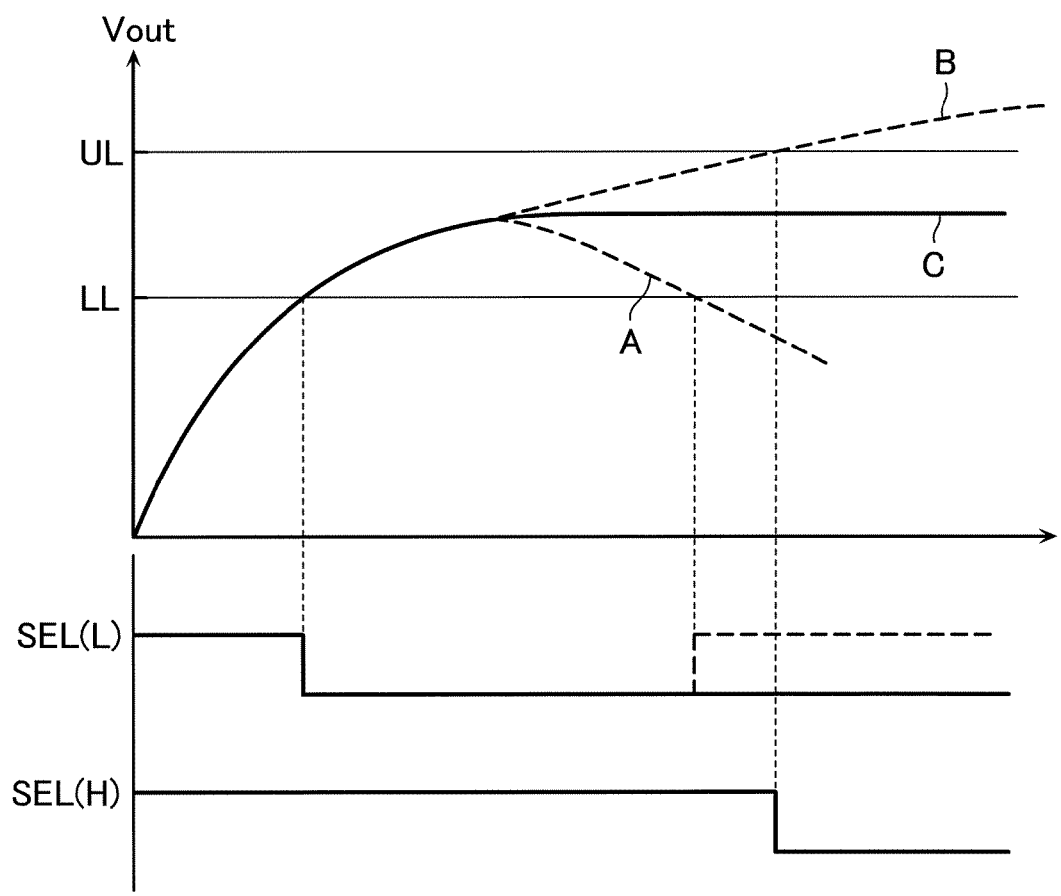
FIG. 10 shows the voltage control state of the boost circuit.

FIG. 10 shows a relationship between the boosted output voltage at the output node Vout and select signals SEL(L), SEL(H). The boosted voltage curve is shown as an ideal one, in which ripples are removed in accordance with this embodiment.

With this output voltage boost curve, a certain voltage range, in which the second pumping control circuit 32 is to be adapted, is defined by the lower level LL and the upper level UP. Comparators CMa and CMb detect the lower level LL and the upper level UP, respectively.

Until the output voltage reaches the lower level LL, select signals are SEL(L)=SEL(R)="H", so that the first pumping control circuit 31 serves. At this time, in the switching circuit 33, transfer gates TD3 and TG4 are activated with "L" output of the exclusive-OR gate G. Therefore, the pump circuit 34 is controlled by the first pumping control circuit 31.

When the output voltage reaches the lower level LL, select signals become as follows: SEL(L)="L", SEL(R)="H". Therefore, in accordance with "H" output of the gate G, transfer gates TG1 and TG2 are activated, so that the pump circuit 34 is controlled by the second pumping control circuit 32.

the voltage control of the second pumping control circuit 32 is not always suitable, and it may occur such a situation that the voltage boost curve is strayed from the ideal curve C, and the voltage falls as shown by a dotted line A or is boosted as shown by another dotted line B due to unknown causes. If the curve falls as shown by the dotted line A to be under the lower level LL, the select signal SEL(L) becomes "H", so that the first pumping control circuit 31 is activated again and returned to the normal pumping control in place of the second pimping control circuit 32.

As the output voltage is boosted as shown by the dotted line B to be over the upper level UL, the select signal SEL(H) becomes "L", so that the first pumping control circuit 31 is selected in place of the second pimping control circuit 32. However, in this case, the first pumping control circuit 31 is kept inactive with SEL(L)="L". Therefore, the voltage output node will be discharged naturally until it becomes under the lower level LL.

As described above, while the output voltage is between the lower level LL and the upper level UL, the control signal of the second pumping control circuit 32 is transferred to the pump circuit 34, whereby output voltage control may be performed without a ripple.

Specifically, constituting the second pumping control circuit 32 such that the clock frequency is variable, it becomes possible to do more desirable voltage control. For example, in case the load of the pump circuit is small, there is a possibility that the boosted voltage output is over-shot. This leads to a cause of erroneous write due to a GIDL current when the boosted voltage is a write voltage or a write pass voltage used in a write mode. By contrast, if the pump control with the second pumping control circuit 32 just after detecting the lower level LL is performed under the condition of the relatively lower clock frequency, it becomes possible to obtain a boost voltage curve, which does not over-shoot.

Figure 11:
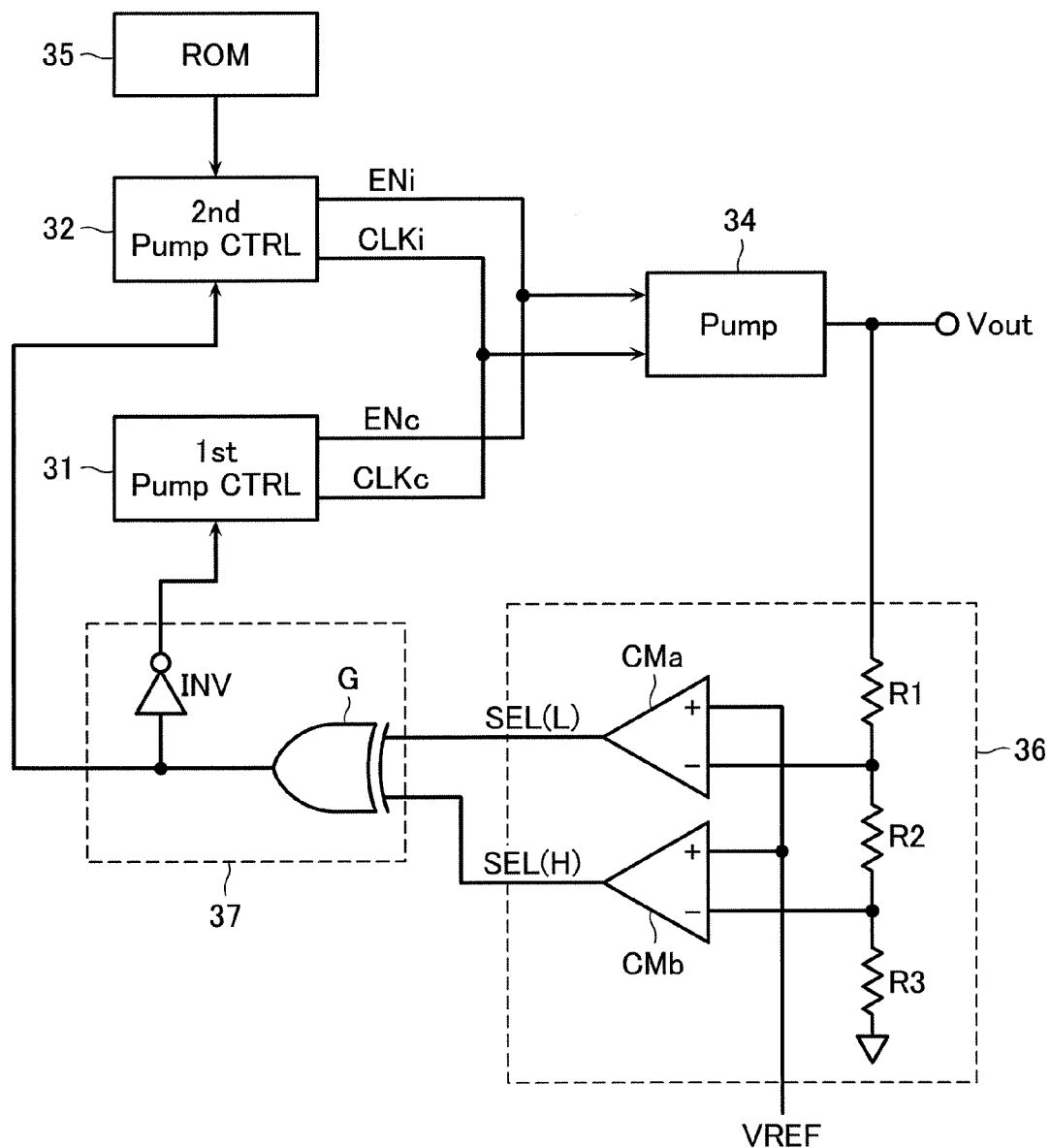
FIG. 11 shows a boost circuit in accordance with another embodiment.

FIG. 11 shows a boost circuit BOOSTi in accordance with another embodiment. The same portions are designated by the same symbols as those in FIG. 6, and the detailed explanation will be omitted. In this embodiment, the first pumping control circuit 31 and the second pumping control circuit 32 are selectively activated without the switching circuit 33.

In place of the switching circuit 33, there is prepared a switching control circuit 37 for selectively activating the first and second pumping control circuits 31 and 32. The switching control circuit 37 has a gate G for taking an exclusive OR logic between the output flags SEL(L) and SEL(R) of the comparators CMa and CMb detecting the lower level LL and the upper level UL, respectively, and an inverter INV for inverting the output of the gate G. The complementary outputs of the switching control circuit 37 serve as activation signals of the first and second pumping control circuit 31 and 32.

With this switching control circuit 37, while the exclusive OR gate G outputs "H", the second pumping control circuit 32 is activated, and inverted output thereof activates the first pumping control circuit 31. When the first or second pumping control circuit 31, 32 is inactive, the output node is set in a high impedance state.

According to this embodiment, while the output voltage is between the lower level LL and the upper level UL, pumping circuit 34 is controlled by the second pumping control circuit 32 in place of the first pumping control circuit 31 like the above described embodiment explained with reference to FIG. 10, and a ripple-free output voltage may be obtained.

Figure 12:
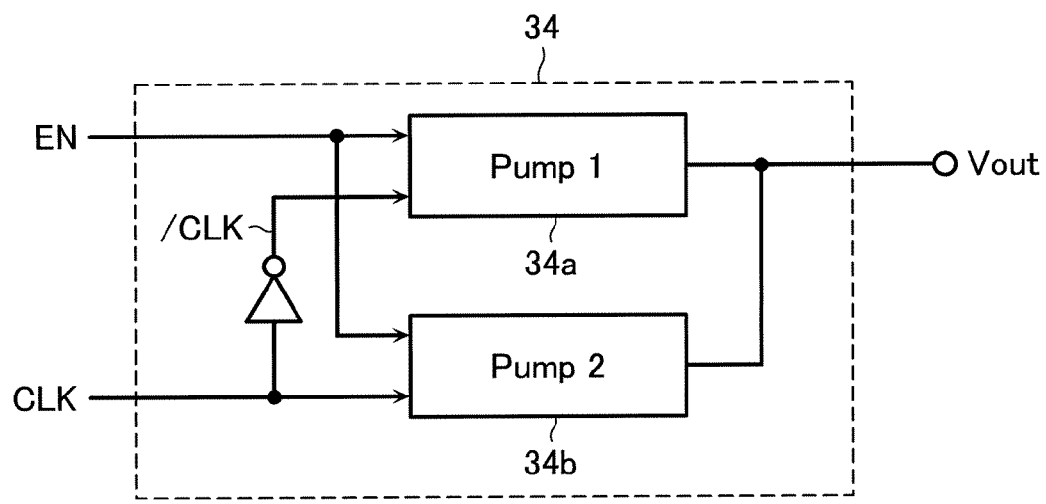
FIG. 12 shows a desirable pump circuit configuration.
Figure 13:
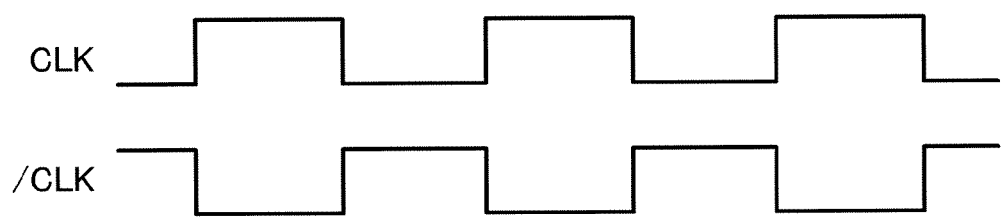
FIG. 13 shows clock waveforms used for the pump circuit.

FIG. 12 shows a desirable configuration example of the pumping circuit 34. The pumping circuit 34 is constituted by two pumps 34a and 34b disposed in parallel, which are driven by complementary clocks CLK and /CLK shown in FIG. 13. With this pumping configuration, while one pump is active to boost voltage, the other is set in a discharge state. Therefore, this pumping circuit itself has a function of outputting a ripple-free output voltage.

Further, explaining in general, it is effective to dispose n($\geq$2) pumps in parallel, which are driven by the respective clocks with phase difference of $2\pi/n$ from each other. With this pumping configuration, it becomes possible to output a ripple-free output voltage.

As an embodiment, an electric card using the non-volatile semiconductor memory devices according to the above-described embodiments of the present invention and an electric device using the card will be described bellow.

Figure 14:
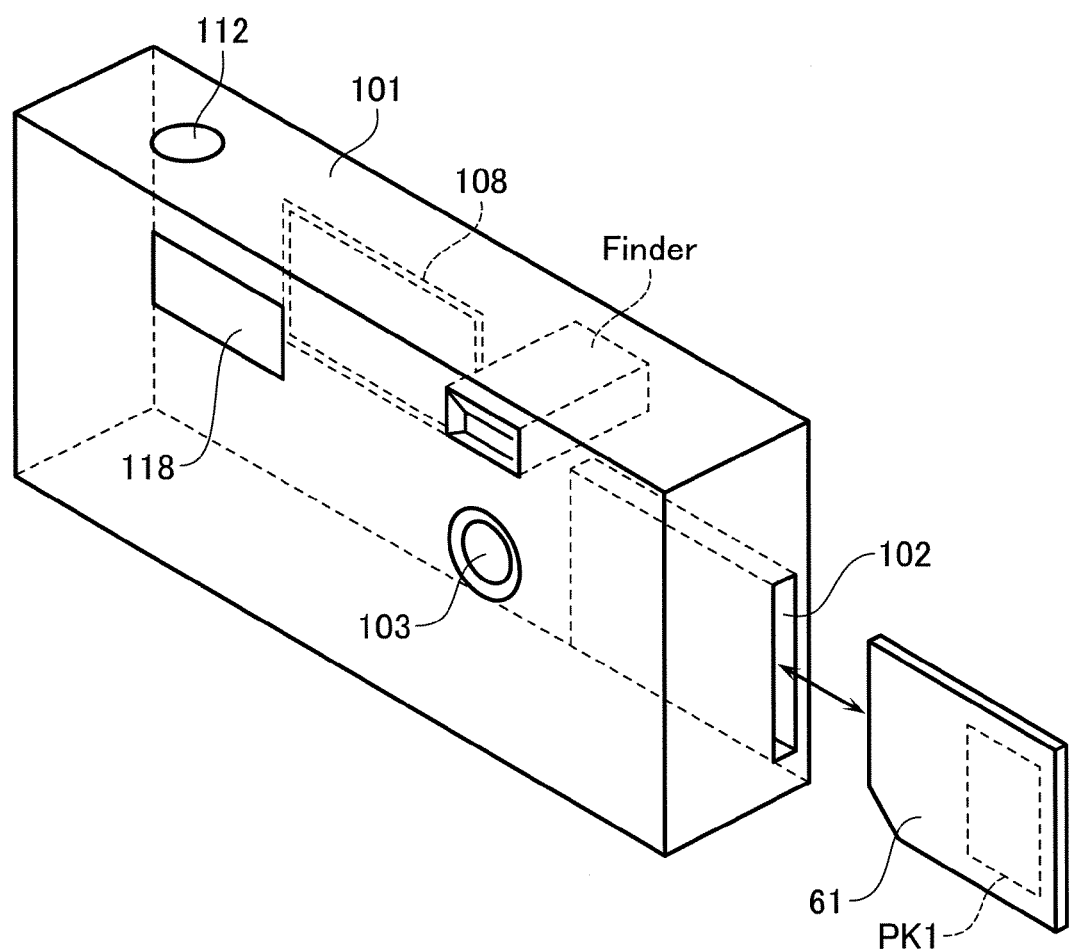
FIG. 14 shows another embodiment applied to a digital still camera.

FIG. 14 shows an electric card according to this embodiment and an arrangement of an electric device using this card. This electric device is a digital still camera 101 as an example of portable electric devices. The electric card is a memory card 61 used as a recording medium of the digital still camera 101. The memory card 61 incorporates an IC package PK1 in which the non-volatile semiconductor memory device or the memory system according to the above-described embodiments is integrated or encapsulated.

The case of the digital still camera 101 accommodates a card slot 102 and a circuit board (not shown) connected to this card slot 102. The memory card 61 is detachably inserted in the card slot 102 of the digital still camera 101. When inserted in the slot 102, the memory card 61 is electrically connected to electric circuits of the circuit board.

If this electric card is a non-contact type IC card, it is electrically connected to the electric circuits on the circuit board by radio signals when inserted in or approached to the card slot 102.

Figure 15:
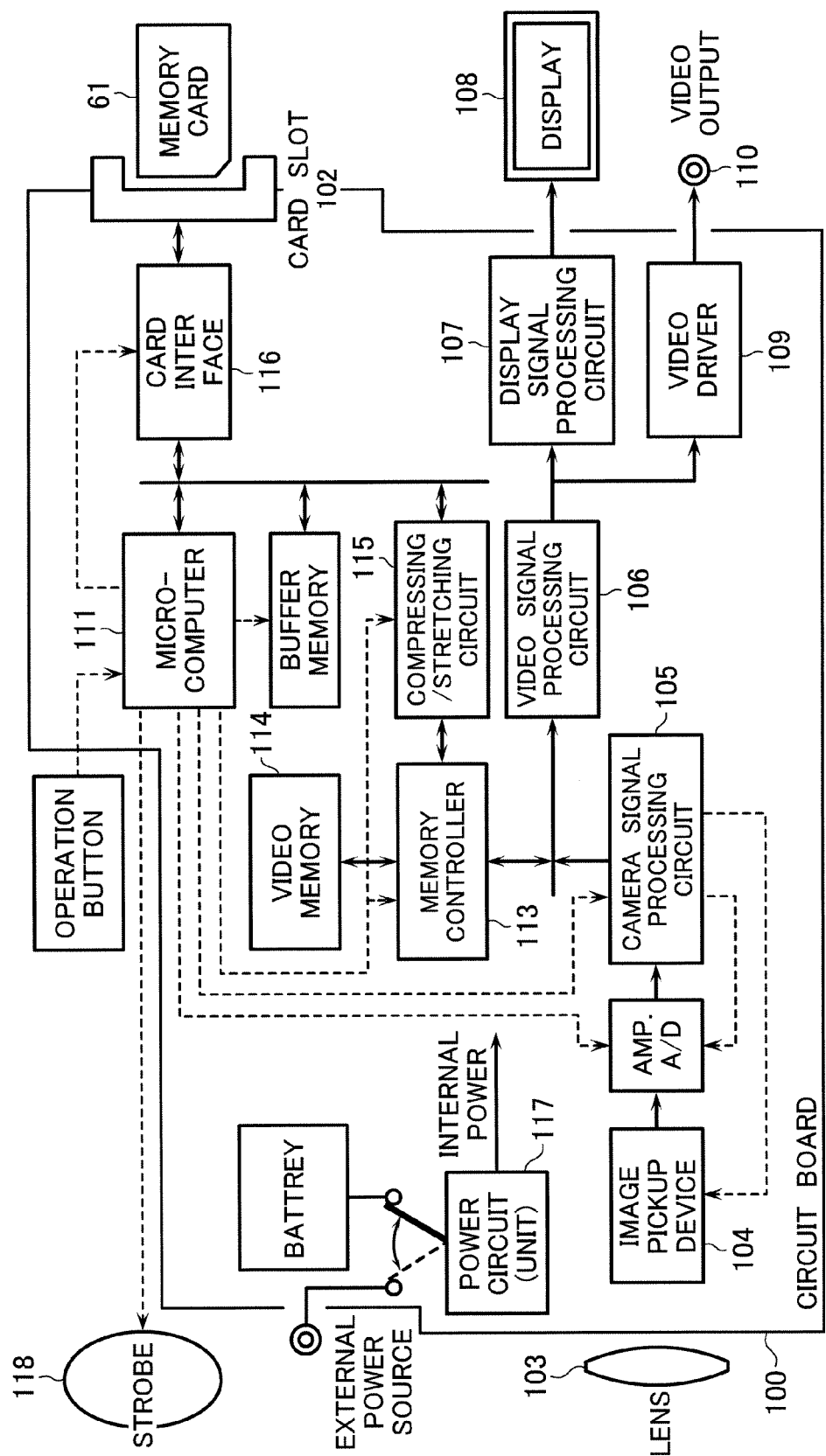
FIG. 15 shows the internal configuration of the digital still camera.
Figure 16A:
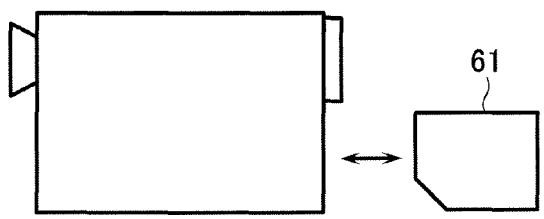
FIGS. 16A to 16J show other electric devices to which the embodiment is applied.
Figure 16B:
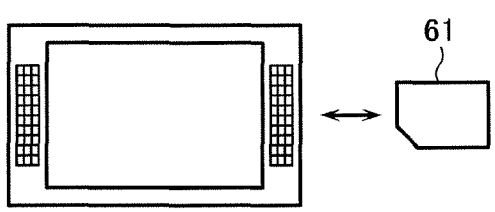
Figure 16C:
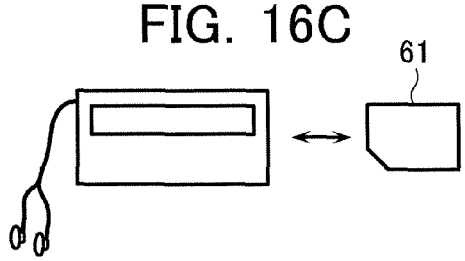
Figure 16D:
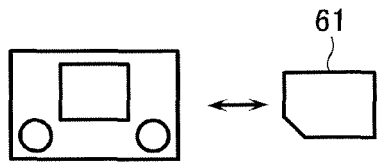
Figure 16E:
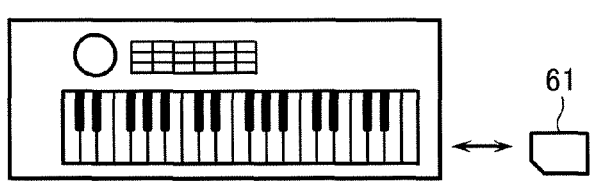
Figure 16F:
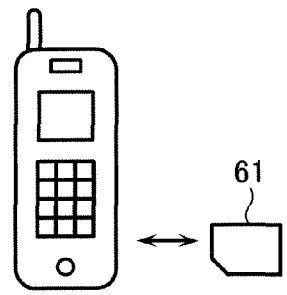
Figure 16G:
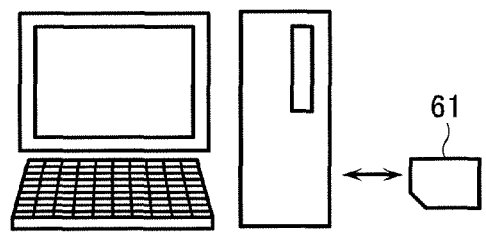
Figure 16H:
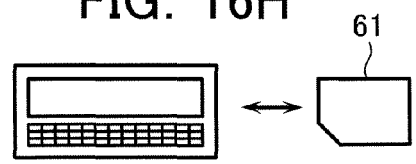
Figure 16I:
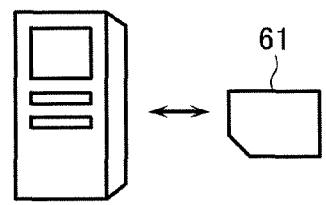
Figure 16J:
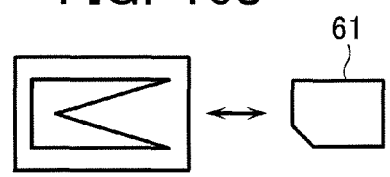

FIG. 15 shows a basic arrangement of the digital still camera. Light from an object is converged by a lens 103 and input to an image pickup device 104. The image pickup device 104 is, for example, a CMOS sensor and photoelectrically converts the input light to output, for example, an analog signal. This analog signal is amplified by an analog amplifier (AMP), and converted into a digital signal by an A/D converter (A/D). The converted signal is input to a camera signal processing circuit 105 where the signal is subjected to automatic exposure control (AE), automatic white balance control (AWB), color separation, and the like, and converted into a luminance signal and color difference signals.

To monitor the image, the output signal from the camera processing circuit 105 is input to a video signal processing circuit 106 and converted into a video signal. The system of the video signal is, e.g., NTSC (National Television System Committee). The video signal is input to a display 108 attached to the digital still camera 101 via a display signal processing circuit 107. The display 108 is, e.g., a liquid crystal monitor.

The video signal is supplied to a video output terminal 110 via a video driver 109. An image picked up by the digital still camera 101 can be output to an image apparatus such as a television set via the video output terminal 110. This allows the pickup image to be displayed on an image apparatus other than the display 108. A microcomputer 111 controls the image pickup device 104, analog amplifier (AMP), A/D converter (A/D), and camera signal processing circuit 105.

To capture an image, an operator presses an operation button such as a shutter button 112. In response to this, the microcomputer 111 controls a memory controller 113 to write the output signal from the camera signal processing circuit 105 into a video memory 114 as a flame image. The flame image written in the video memory 114 is compressed on the basis of a predetermined compression format by a compressing/stretching circuit 115. The compressed image is recorded, via a card interface 116, on the memory card 61 inserted in the card slot.

To reproduce a recorded image, an image recorded on the memory card 61 is read out via the card interface 116, stretched by the compressing/stretching circuit 115, and written into the video memory 114. The written image is input to the video signal processing circuit 106 and displayed on the display 108 or another image apparatus in the same manner as when image is monitored.

In this arrangement, mounted on the circuit board 100 are the card slot 102, image pickup device 104, analog amplifier (AMP), A/D converter (A/D), camera signal processing circuit 105, video signal processing circuit 106, display signal processing circuit 107, video driver 109, microcomputer 111, memory controller 113, video memory 114, compressing/stretching circuit 115, and card interface 116.

The card slot 102 need not be mounted on the circuit board 100, and can also be connected to the circuit board 100 by a connector cable or the like.

A power circuit 117 is also mounted on the circuit board 100. The power circuit 117 receives power from an external power source or battery and generates an internal power source voltage used inside the digital still camera 101. For example, a DC-DC converter can be used as the power circuit 117. The internal power source voltage is supplied to the respective circuits described above, and to a strobe 118 and the display 108.

As described above, the electric card according to this embodiment can be used in portable electric devices such as the digital still camera explained above. However, the electric card can also be used in various apparatus such as shown in FIGS. 16A to 16J, as well as in portable electric devices. That is, the electric card can also be used in a video camera shown in FIG. 16A, a television set shown in FIG. 16B, an audio apparatus shown in FIG. 16C, a game apparatus shown in FIG. 16D, an electric musical instrument shown in FIG. 16E, a cell phone shown in FIG. 16F, a personal computer shown in FIG. 16G, a personal digital assistant (PDA) shown in FIG. 16H, a voice recorder shown in FIG. 16I, and a PC card shown in FIG. 16J.

This invention is not limited to the above-described embodiment. It will be understood by those skilled in the art that various changes in form and detail may be made without departing from the spirit, scope, and teaching of the invention.

What is claimed is:

1. A voltage generating circuit comprising:
   a pumping circuit configured to boost a power supply voltage in accordance with a charge transfer operation;
   a voltage detection circuit configured to detect the output voltage of the pumping circuit;
   a first pumping control circuit configured to control the pumping circuit in accordance with the output of the voltage detection circuit; and
   a second pumping control circuit configured to control the pumping circuit in place of the first pumping control circuit when the output voltage of the pumping circuit is in a certain range;
   wherein the pumping circuit comprises,

9 a charge transfer circuit having multiple diodes connected in series between a power supply node and the voltage output node of the pumping circuit and capacitors, one ends thereof being coupled to the respective connection nodes of the diodes, for boosting the power supply voltage in accordance with one directional charge transferring, a first clock generating circuit selected by the first pumping control circuit to drive the other ends of the capacitors of the charge transfer circuit with a constant clock frequency, and a second clock generating circuit selected by the second pumping control circuit to drive the other ends of the capacitors of the charge transfer circuit with a variable clock frequency.

2. The voltage generating circuit according to claim 1, further comprising:

a ROM circuit configured to store the control data of the second pumping control circuit, the control data being determined based on the previously measured leakage property of the pumping circuit and written in the ROM circuit.

3. The voltage generating circuit according to claim 1, further comprising:

a switching circuit configured to select one of the control signals of the first and second pumping control circuits and transfer it to the pumping circuit.

4. The voltage generating circuit according to claim 3, wherein the voltage detection circuit comprises:

a resistance divider circuit having multiple resistances connected in series between the voltage output node of the pumping circuit and the ground potential node;

a first comparator for comparing the voltage at a first tap of the resistance divider circuit with a reference voltage to detect that the output voltage of the pumping circuit reaches a first level; and a second comparator for comparing the voltage at a second tap of the resistance divider circuit with the reference voltage to detect that the output voltage of the pumping circuit reaches a second level higher than the first level, and wherein the switching circuit is controlled by the first and second comparators to transfer the control signal of the second pumping control circuit to the pumping circuit in place of the first pumping control circuit when the output voltage of the pumping circuit is between the first level and the second level.

5. The voltage generating circuit according to claim 1, further comprising:

a switching control circuit configured to activate one of the first and second pumping control circuits and set the other in an inactive state with high output impedance.

6. The voltage generating circuit according to claim 5, wherein the voltage detection circuit comprises:

a resistance divider circuit having multiple resistances connected in series between the voltage output node of the pumping circuit and the ground potential node;

a first comparator for comparing the voltage at a first tap of the resistance divider circuit with a reference voltage to detect that the output voltage of the pumping circuit reaches a first level; and a second comparator for comparing the voltage at a second tap of the resistance divider circuit with the reference

10 voltage to detect that the output voltage of the pumping circuit reaches a second level higher than the first level, and wherein the switching control circuit activates the second pumping control circuit in place of the first pumping control circuit when the output voltage of the pumping circuit is between the first level and the second level in accordance with the output state of the first and second comparators.

7. The voltage generating circuit according to claim 1, wherein the pumping circuit has $n(\geq 2)$ pumps disposed in parallel, which are driven by the respective clocks with phase difference of $2\pi/n$ from each other.

8. A semiconductor memory device with an internal voltage generating circuit, the internal voltage generating circuit comprising:

a pumping circuit configured to boost a power supply voltage in accordance with a charge transfer operation;

a voltage detection circuit configured to detect the output voltage of the pumping circuit;

a first pumping control circuit configured to control the pumping circuit in accordance with the output of the voltage detection circuit; and a second pumping control circuit configured to control the pumping circuit in place of the first pumping control circuit when the output voltage of the pumping circuit is in a certain range;

wherein the pumping circuit comprises, a charge transfer circuit having multiple diodes connected in series between a power supply node and the voltage output node of the pumping circuit and capacitors, one ends thereof being coupled to the respective connection nodes of the diodes, for boosting the power supply voltage in accordance with one directional charge transferring, a first clock generating circuit selected by the first pumping control circuit to drive the other ends of the capacitors of the charge transfer circuit with a constant clock frequency, and a second clock generating circuit selected by the second pumping control circuit to drive the other ends of the capacitors of the charge transfer circuit with a variable clock frequency.

9. The semiconductor memory device according to claim 8, wherein the internal voltage generating circuit further comprises:

a ROM circuit configured to store the control data of the second pumping control circuit, the control data being determined based on the previously measured leakage property of the pumping circuit and written in the ROM circuit.

10. The semiconductor memory device according to claim 1, wherein the internal voltage generating circuit further comprises:

a switching circuit configured to select one of the control signals of the first and second pumping control and transfer it to the pumping circuit.

11. The semiconductor memory device according to claim 10, wherein the voltage detection circuit comprises:

a resistance divider circuit having multiple resistances connected in series between the voltage output node of the pumping circuit and the ground potential node;

a first comparator for comparing the voltage at a first tap of the resistance divider circuit with a reference voltage to detect that the output voltage of the pumping circuit reaches a first level; and a second comparator for comparing the voltage at a second tap of the resistance divider circuit with the reference voltage to detect that the output voltage of the pumping circuit reaches a second level higher than the first level, and wherein the switching circuit is controlled by the first and second comparators to transfer the control signal of the second pumping control circuit to the pumping circuit in place of the first pumping control circuit when the output voltage of the pumping circuit is between the first level and the second level.

12. The semiconductor memory device according to claim 8, wherein the internal voltage generating circuit further comprises:

a switching control circuit configured to activate one of the first and second pumping control circuits and set the other in an inactive state with high output impedance.

13. The semiconductor memory device according to claim 12, wherein the voltage detection circuit comprises:

a resistance divider circuit having multiple resistances connected in series between the voltage output node of the pumping circuit and the ground potential node;

a first comparator for comparing the voltage at a first tap of the resistance divider circuit with a reference voltage to detect that the output voltage of the pumping circuit reaches a first level; and a second comparator for comparing the voltage at a second tap of the resistance divider circuit with the reference voltage to detect that the output voltage of the pumping circuit reaches a second level higher than the first level, and wherein the switching control circuit activates the second pumping control circuit in place of the first pumping control circuit when the output voltage of the pumping circuit is between the first level and the second level in accordance with the output state of the first and second comparators.

14. The semiconductor memory device according to claim 8, wherein the pumping circuit has n($\geq 2$) pumps disposed in parallel, which are driven by the respective clocks with phase difference of $2\pi/n$ from each other.

15. The semiconductor memory device according to claim 8, wherein the memory device has a memory cell array, in which electrically rewritable and non-volatile memory cells are arranged.

16. The semiconductor memory device according to claim 15, wherein the memory cell array has NAND cell units arranged therein, each of which has multiple memory cells corrected in series.

17. The semiconductor memory device according to claim 15, wherein the memory device stores data of multi bits per cell.

* * * * *